US008516339B1

(12) United States Patent
Lesea et al.

(10) Patent No.: US 8,516,339 B1
(45) Date of Patent: Aug. 20, 2013

(54) METHOD OF AND CIRCUIT FOR CORRECTING ADJACENT BIT ERRORS IN A MEMORY

(75) Inventors: Austin H. Lesea, Los Gatos, CA (US); Stephen M. Trimberger, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 242 days.

(21) Appl. No.: 13/078,172

(22) Filed: Apr. 1, 2011

(51) Int. Cl.
*G11C 29/00* (2006.01)

(52) U.S. Cl.
USPC .......................... 714/763; 714/755; 714/758

(58) Field of Classification Search
USPC .......................................... 714/755, 763, 758
See application file for complete search history.

(56) References Cited

U.S. PATENT DOCUMENTS

| 3,644,902 | A | * | 2/1972 | Beausoleil | 365/200 |
| 4,547,882 | A | * | 10/1985 | Tanner | 714/755 |
| 5,490,155 | A | * | 2/1996 | Abdoo et al. | 714/763 |
| 6,429,682 | B1 | | 8/2002 | Schultz et al. | |
| 7,254,800 | B1 | | 8/2007 | Trimberger | |
| 7,426,678 | B1 | * | 9/2008 | Cory et al. | 714/785 |
| 7,539,926 | B1 | | 5/2009 | Lesea | |
| 8,122,317 | B1 | * | 2/2012 | Clark et al. | 714/758 |
| 2006/0156177 | A1 | * | 7/2006 | Kottapalli et al. | 714/758 |
| 2011/0239082 | A1 | * | 9/2011 | Yang | 714/755 |

OTHER PUBLICATIONS

Chapman, Ken et al., *SEU Strategies for Virtex-5 Devices*, XAPP864 (v1.0.1), Mar. 5, 2009, pp. 1-29, Xilinx, Inc., San Jose, CA, USA.
Chapman, Ken, *SEU Strategies for Virtex-5 Devices*, XAPP864 (v2.0), Apr. 1, 2010, pp. 1-16, Xilinx, Inc., San Jose, CA, USA.
Carmichael, Carl et al., *Correcting Single-Event Upsets Through Virtex Partial Configuration*, XAPP216 (v1.0), Jun. 1, 2000, pp. 1-12, Xilinx, Inc., San Jose, CA, USA.
Lim, David et al., *Two Flows for Partial Reconfiguration: Module Based or Small Bit Manipulations*, XAPP290 (v1.0), May 17, 2002, pp. 1-23, Xilinx, Inc., San Jose, CA, USA.
Eto, Emi, *Difference-Based Partial Reconfiguration*, XAPP290 (v2.0), Dec. 3, 2007, pp. 1-11, Xilinx, Inc., San Jose CA, USA.
Tam, Simon, *Single Error Correction and Double Error Detection*, XAPP645 (v2.2), Aug. 9, 2006, pp. 1-12, Xilinx, Inc., San Jose, CA, USA.
Xilinx, Inc., *LogiCORE IP Soft Error Mitigation Controller v1.2*, DS796, Dec. 14, 2010, pp. 1-14, Xilinx, Inc., San Jose, CA, USA.
Xilinx, Inc., *Virtex-6 FPGA Configuration User Guide*, UG360 (v3.2), Nov. 1, 2010, pp. 1-180, Xilinx, Inc., San Jose, CA, USA.
U.S. Appl. No. 13/490,269, filed Jun. 6, 2012, Rahul et al.
U.S. Appl. No. 13/490,322, filed Jun. 6, 2012, Rahul et al.
Dutta, Avijit et al., "Multiple Bit Upset Tolerant Memory Using a Selective Cycle Avoidance Based SEC-DED-DAEC Code," *Proc. of the 25th IEEE VLSI Test Symposium*, May 6, 2007, pp. 349-354, IEEE, Piscataway, New Jersey, USA.

* cited by examiner

*Primary Examiner* — Sam Rizk
(74) *Attorney, Agent, or Firm* — John J. King

(57) ABSTRACT

A method of correcting adjacent bit errors in a memory is disclosed. The method comprises determining that there are errors in each set of two non-overlapping sets of the memory; changing a stored value of a memory cell of the memory until it is determined that a single error exists in the memory; identifying a location of the single error in the memory; and correcting the single error in the memory. A circuit for detecting adjacent bit errors in a memory having alternating even memory cells and odd memory cells is also disclosed.

19 Claims, 9 Drawing Sheets

| Bit Positions | 1 | 2 | 3 | 4 | 5 | 6 | 7 | 8 |
|---|---|---|---|---|---|---|---|---|
| Encoded Data Bits | p1 | p2 | d1 | p4 | d2 | d3 | d4 | p8 |
| Bits covered By Parity Bits — p1 | X | | X | | X | | X | |
| p2 | | X | X | | | X | X | |
| p4 | | | | X | X | X | X | |
| p8 | | X | | X | | X | | X |

METHOD OF AND CIRCUIT FOR CORRECTING ADJACENT BIT ERRORS IN A MEMORY

FIELD OF THE INVENTION

The present invention relates generally to integrated circuit devices having memory, and in particular, to correcting adjacent bit errors in a memory.

BACKGROUND

Memory cells are implemented in devices such as integrated circuits to store data. The data may be used during operation of the device or, in the case of programmable integrated circuits, may be used to configure the integrated circuit to perform functions desired by the user of the device. However, for a variety of reasons, data may become corrupted. The corrupted data may impact the performance of the integrated circuit. In some instances, the corrupted data may render the integrated circuit unusable until the correct data is restored in the memory. While techniques exist to both detect and correct data errors without having to reload the entire memory, such techniques have significant limitations.

For an integrated circuit to continuously function properly, it is necessary that the data stored in a memory is not corrupted. Accordingly, data is often read back to determine whether there is an error in the stored data. Error checking may include both error detection and correction in the case of a single error, or error detection without error correction in the case of multiple errors. However, error correction has significant limitations. More particularly, as the dimensions of transistors continue to decrease, conventional techniques will not enable the correction of all errors in memory.

SUMMARY

A method of correcting adjacent bit errors in a memory is disclosed. The method comprises determining that there are errors in each set of two non-overlapping sets of memory cells of the memory; changing a stored value of a memory cell of the memory until it is determined that a single error exists in the memory; identifying a location of the single error in the memory; and correcting the single error in the memory.

According to some embodiments, identifying the location of the single error in the memory may comprise selecting a first memory cell adjacent to the memory cell having the stored value which was changed. Further, correcting the single error in the memory may comprise changing a stored value of the first memory cell. The method may further comprise selecting, if the single error in the memory is not corrected by changing the stored value in the first memory cell, a second memory cell adjacent to the memory cell having the stored value which was changed. Also, the method may comprise establishing a first parity bit associated with a first set of two non-overlapping sets of memory cells and a second parity bit associated with a second set of the two non-overlapping sets of memory cells. The method may further comprise determining that there are errors in two memory cells of the memory. Finally, identifying a location of the single error in the memory may comprise evaluating an error correction code after changing a stored value of the memory cell of the memory until it is determined that the single error is present in the memory.

According to an alternate embodiment, a method of correcting adjacent bit errors in a memory comprises establishing a first parity bit for a first set of memory cells of two non-overlapping sets of memory cells; establishing a second parity bit for a second set of memory cells of the two non-overlapping sets of memory cells; reading back data from the first set and the second set of memory cells of the memory; determining that an error exist in both the first set of memory cells and the second set of the memory; and correcting the errors in the first set of memory cells and the second set of memory cells of the memory.

According to the alternate embodiment, correcting the errors in the first set of memory cells and the second set of memory cells of the memory may comprise changing a stored value of a memory cell of the memory until it is determined that a single error is present in the memory. The method may further comprise identifying a location of the single error in the memory by switching a bit of a first memory cell adjacent to the memory cell having the stored value which was changed. Alternatively, the method may further comprise identifying a location of the single error in the memory by evaluating an error correction code. An overall parity bit may be generated based upon the first parity bit associated with the even memory cells and the second parity bit associated with the odd memory cells, where the overall parity bit is used to determine that two error exist in the memory. Further, reading back data from the first set of memory cells and the second set of memory cells of the memory may comprise continuously reading back frames of data from the memory.

A circuit for detecting adjacent bit errors in a memory is also disclosed. The circuit comprises a parity bit generator coupled to receive data bits and generate at least a first parity bit for data stored in a first set of memory cells of two non-overlapping sets of the memory and a second parity bit for data stored in a second set of memory cells of the two non-overlapping set of memory cells of the memory, the parity bit generator providing data having the first parity bit and the second party bit to the memory; and a data correction circuit coupled to the memory, the data correction circuit enabling the correction of adjacent bit errors in data read back from the memory.

According to some embodiments, the circuit may further comprise an overall parity bit generator coupled to receive the first parity bit and the second parity bit from the data read back from the memory, where the overall parity bit generator provides an overall parity bit based upon the first parity bit and the second parity bit. The circuit may also comprise a syndrome generator coupled to receive the data read back from the memory. The syndrome generator may generate a syndrome associated with data read back from memory, and an adjacent bit error signal based upon the syndrome. The syndrome generator may further comprise a check bit generator coupled to receive the data read back from memory, where the check bit generator generates the syndrome comprising check bits corresponding to the parity bits of the data bits stored in the first set of memory cells and the data bits stored in the second set of memory cells. The circuit may further comprise an error detector coupled to the syndrome generator, the error detector generating an error signal based upon the syndrome.

DETAILED DESCRIPTION

Certain applications of integrated circuits, such as military, aerospace, and high-reliability communication applications, require detection of errors even when the likelihood of such an occurrence is extremely low. Furthermore, applications running in redundant systems require fast indication of a single event upset (SEU) in order to minimize the impact upon operation. In many cases, fast correction with minimal impact upon operation is also required. The detection of errors for some high-reliability systems is important to ensure very high uptime. In certain applications, the automatic correction of errors may also be a significant advantage. When processing real-time streaming data such as a video signal, for example, automatic correction of errors allows operation to continue without the need for a system reset. At a minimum, continuous error correction allows a much faster system recovery because programmable resources of a device do not have to be completely reconfigured, possibly causing system downtime.

Further, it is possible in integrated circuits manufactured with processing technologies enabling small geometry transistors for one cosmic particle to create upsets in two memory cells. Correcting multiple errors in general may require a large amount of additional memory for additional check bits, but when an upset in a memory occurs as a result of a cosmic particle, there is a possibility that the upset will affect two adjacent memory cells. More particularly, if the upset creates errors in more than one memory cell, there is a high probability that the upsets are in adjacent memory cells. As will be set forth below in reference to the various embodiments, errors in adjacent bits of a memory may be both detected and corrected.

Figure 1:
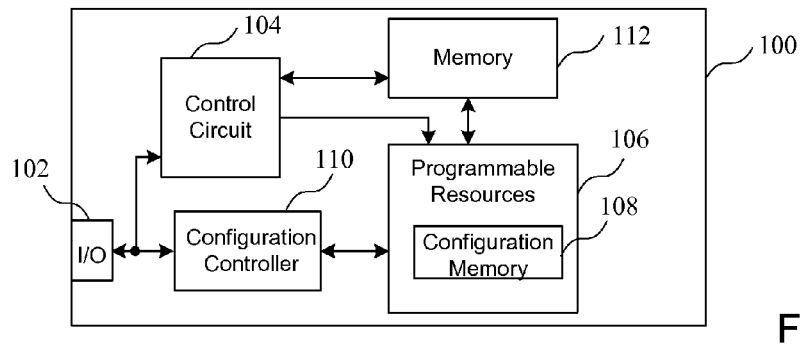
FIG. 1 is a block diagram of a circuit for correcting bit errors in a memory according to an embodiment.

Turning first to FIG. 1, a block diagram of a circuit for correcting adjacent bit errors in a memory according to an embodiment is shown. The circuit of FIG. 1 is implemented in an integrated circuit 100 having an input/output (I/O) port 102 coupled to a control circuit 104 and programmable resources 106. As will be described in more detail below, the programmable resources may include programmable logic, such as the programmable logic described in reference to FIGS. 13 and 14. The programmable resources include circuit elements which are configurable by a user of the circuit to implement a circuit design of the user's choice.

The circuits implemented in the programmable resources may be implemented according to configuration data downloaded to the integrated circuit 100. As will be described in more detail below, the programmable resources 106 include configuration memory 108. Generally, configuration memory 108 includes memory cells for configuring the programmable resources based upon configuration bits of the configuration data. Although a single configuration resource block 106 and configuration memory 108 is shown, a given integrated circuit may include a plurality of blocks having configurable resources controlled by configuration memory. Also, the integrated circuit 100 may include a memory 112, such as a non-volatile memory external to the programmable resources, for storing configuration data.

A configuration controller 110 may be implemented, as a part of or separate from the control circuit 104, to load the configuration data into the configuration memory 108. The configuration data may be loaded directly by the configuration controller 110 by way of the I/O port 102, or by way of the control circuit 104 and the memory 112. As will be described in more detail below, the data stored in the configuration memory 108 may be continuously monitored, and a partial reconfiguration may be performed in the event that adjacent bit errors are detected to correct the adjacent bit errors without reloading an entire frame of data in the configuration memory. The circuit of FIG. 1 may be any device having programmable resources or sensitive data storage, such as a programmable logic device described below, or an application-specific integrated circuit (ASIC) having a portion of circuits which is programmable, or a memory that stores sensitive data, for example.

Figure 2:
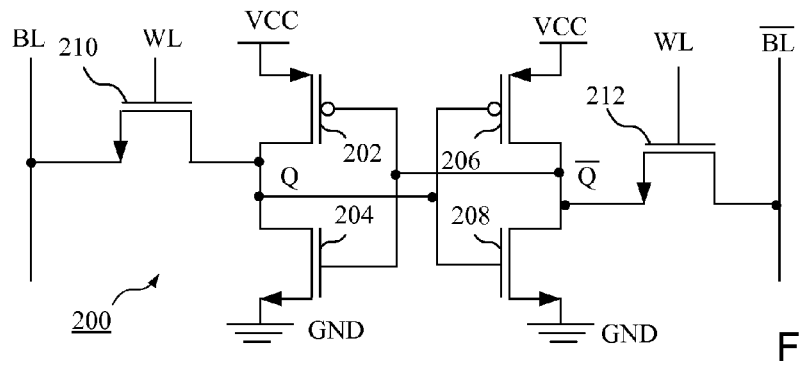
FIG. 2 is a block diagram of a memory cell of the configuration memory of FIG. 1 according to an embodiment.

Turning now to FIG. 2, a block diagram of memory cell 200 according to an embodiment is shown. The memory cell 200 could be implemented in the configuration memory 108 of FIG. 1, for example. The memory cell includes an inverter having a p-channel transistor 202 with a source coupled to a reference voltage, such as VCC, and a drain coupled at a first node "Q" to a drain of an n-channel transistor 204, the source of which is coupled to a ground (GND) potential. The memory cell includes a second inverter having a p-channel transistor 206 with a source coupled to the reference voltage and a drain coupled at a second node "Q-bar" to a drain of an n-channel transistor 208, the source of which is also coupled to ground. The first node "Q" is controlled by an n-channel transistor 210 coupled to receive a word line (WL) signal at its gate which controls the receipt of input data on a bit line (BL) at the first node. The second node "Q-bar" is controlled by another n-channel transistor 212 coupled to receive the word line signal at its gate which controls the receipt of inverted input data at the second node. While the memory cell of FIG. 2 is shown by way of example, other memory cells could be employed, such as a dynamic random access (DRAM) memory cell. Depending upon the dimensions of the transistors of a memory, and particularly the gate widths of the transistors of a memory, a particle associated with cosmic radiation may affect a number of transistors. If the gate widths are small enough, the cosmic radiation may affect transistors of adjacent memory cells.

Figure 3:
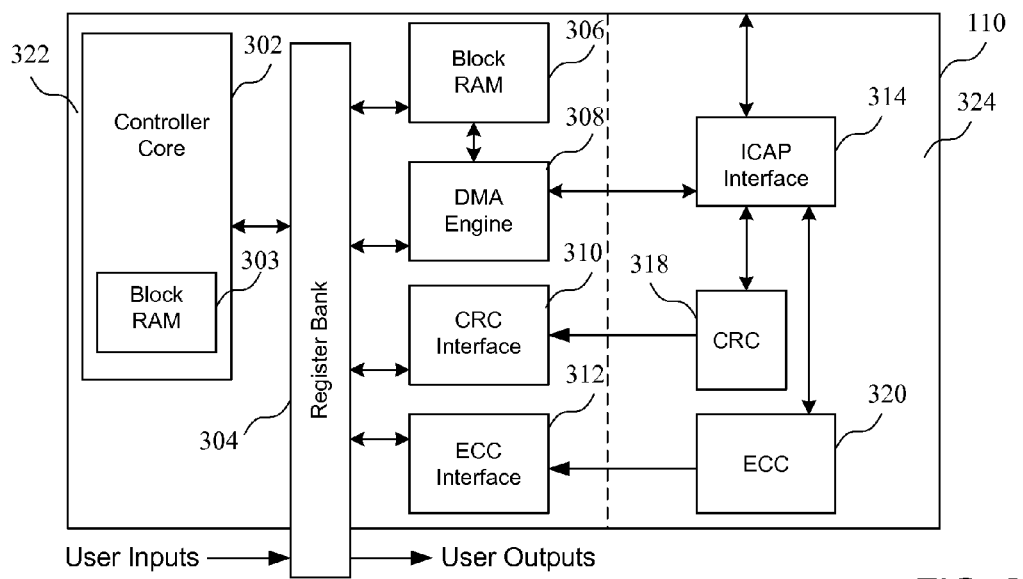
FIG. 3 is a block diagram of the configuration controller 110 of FIG. 1 according to an embodiment.

Turning now to FIG. 3, a block diagram of configuration controller 110 of FIG. 1 according to an embodiment is shown. The configuration controller 110 includes a controller core 302 having a block of random access memory (BRAM) 303 coupled to a register bank 304. As will be described in more detail below, the controller core 302 is used to perform the continuous reading back of the configuration bits stored in a memory, such as the configuration memory 108 of FIG. 1. A separate BRAM 306 is coupled to the register bank 304 and a direct memory access (DMA) engine 308. The register bank is also coupled to a cyclic redundancy check (CRC) Interface 310 and an error correction code (ECC) interface 312. The DMA engine 308 is coupled to an internal configuration access port (ICAP) interface 314 which interfaces with configuration memory, such as configuration memory 108 of FIG. 1, to enable reading back configuration data stored in the integrated circuit 100. The ICAP interface also provides an interface to a CRC circuit 318 enabling a CRC of data and an ECC circuit 320 enabling ECC error detection, each of which will be described in more detail below.

The ICAP interface 314 enables both reading data back in order to generate check bits, as well as writing the correct data of a frame which was determined to be erroneous back to the memory. As each frame is read back from the configuration memory 108, the configuration controller 110 keeps track of the frame address and stores the frame of data received by way of the ICAP interface in the BRAM 303. In the event of an error, the controller core 302 uses the output of the ECC circuit 320 to determine whether an error is a single-bit or a double-bit error. In the event of a single-bit error, a syndrome generated by the ECC circuit 320 can be used to repair the errors of the stored frame. The repaired frame can then be written back through ICAP to the configuration memory 108. As will be described in more detail below, the ECC circuit 320 according to various embodiments enables both the detection and correction of errors in adjacent cells of the memory. More particularly, the controller core 302 also enables flipping one or more bits back to their original state, as will be described in more detail below.

The register bank 304 provides an interface between the controller core 302 and the rest of the configuration controller 110. The register bank 304 allows the controller core 302 to access inputs and outputs of the integrated circuit, as well as to control the DMA engine 308 that is responsible for managing the flow of configuration data by way of the ICAP interface 314. The register bank 304 also provides controller core 302 access to the CRC circuit 318 by way of the CRC interface 310 and access by the controller core 302 to the ECC circuit 320 by way of the ECC interface. While the elements of FIG. 3 may be implemented in various arrangements of hard-wired circuits and circuits implemented in programmable resources, the circuits may be implemented in portions comprising a configurable portion 322 (e.g., implemented in programmable resources as will be described in more detail below) and a hard-wired portion 324, for example.

Configuration data is generally loaded into and read from the configuration memory in frames, as will be described in more detail in reference to FIG. 6. As each frame of a configuration bitstream is read, the CRC and ECC interfaces are monitored. In the event of an error, the controller core 302 provides an indication of an error and determines what, if any, action should be taken in response. According to the various embodiments set forth below, the data is read back continuously. The continuous reading back and monitoring of the stored data enables fast detection of errors and the correction of correctable errors, including two adjacent errors which would not be correctable using conventional methods.

Parity bits are often used to identify an error in data stored in a memory. In general, a parity bit is a bit that indicates whether the number of logical "1" bits in a portion of data is even or odd. If an odd number of bits of the portion of data is changed from the original data, the message will change parity, enabling the detection of the error. The most common convention for parity is that a parity value of a logical "1" indicates that there is an odd number of logical "1s" in the portion of the data, and a parity value of a logical "0" indicates that there is an even number of "1s" in the portion of the data. As a result, the data and the parity bit together should contain an even number of logical "1s." It should be noted that when evaluating stored data for errors, a bit that changed may have been the parity bit itself. Accordingly, check bits that are generated to detect an error are based upon the data including any parity bits. A circuit for generating parity bits will be described in more detail in reference to FIG. 8.

Because it is necessary to know the location of an error to correct the error, error detection techniques which only indicate the presence of errors (such as the number of errors) but not the location of errors cannot be used alone to correct errors. One conventional technique for detecting and in some cases correcting an error in a frame of data is a single error correction-double error detection ("SECDED") decoding technique. SECDED codes for encoding information, such as "Hamming codes," may be used for decoding data, where parity bits are added to a set of original data bits. For SECDED decoding, if any one bit, including a data or parity bit, of a transmission is in error, the error can be detected and corrected. If any two bits of a transmission are in error, the errors can be detected although it cannot be corrected using conventional circuits and techniques.

According to one embodiment, a Hamming code may be implemented in order to identify the location of an error. More particularly, the function of the ECC circuit 320 could be implemented using a Hamming code. A Hamming code is an ECC code that involves transmitting data with multiple parity bits and decoding associated check bits generated based upon data which is being evaluated for errors. A circuit for generating check bits will be described in more detail in reference to FIG. 10. Data being evaluated for errors could be, for example, data received at an integrated circuit, such as configuration bits being coupled to the integrated circuit from an external memory, or data which is stored in configuration memory and read back from the configuration memory of the integrated circuit. However, it should be understood that the circuits and methods for correcting adjacent bit errors could be implemented with any data stored in any type of memory.

When data to be evaluated for errors is read back from a memory, the check bits of the data read back from memory should be zero if none of the bits including the data bits and the parity bits have been corrupted. The generated checkbits, called the syndrome, will also indicate the location of a single bit error. The concatenation of data bits and the parity bits of a Hamming code is described by an ordered set (d+p,d) where d is the width of the data and p is the width of the parity. The minimum number of check bits required for a single bit error correction is derived from the equation $d+p+1 \leq 2^p$.

To detect errors, check bits are generated from evaluating the "exclusive ORing" (XORing) of certain bits of a Hamming code which are read back from memory. That is, the check bits of a syndrome are generated based upon the data which is being evaluated for errors including the parity bits. If one or more bit errors is introduced in the stored data, several check bits show errors. The combination of these check bit errors enables determining the nature of the error. If all of the elements of the syndrome vector are zeros, no error is reported. Any other non-zero result represents the bit error type and provides the location of any single bit errors to enable restoring the original data.

If the bits are numbered in sequence, the bit positions that represent powers of two are dedicated to parity bits of the Hamming code. One additional parity bit in an extended Hamming code is used to detect double errors. This extra parity bit is an overall parity bit and is generated by XOR-ing all the data bits and parity bits. While Hamming codes have been used in conventional devices to detect and possibly correct errors in a vertical arrangement of memory cells of a memory array, the location of multiple errors cannot be detected. When all syndrome bits are zero, there are no errors. If a single bit error occurs, several bits of the syndrome have odd parity (i.e. parity resulting in a logic one), enabling the determination of the location of a bit error. For example, the syndrome will indicate the column and row location of a memory cell of a memory array having a bit error. While double bit errors are not correctable using conventional techniques, it is still possible to detect a double bit error by adding the additional parity bit that covers every bit. However, while the presence of two (or more) errors in a frame may be detected using ECC techniques, the presence of two adjacent bit errors is not reliably detected by the ECC. It is possible to detect and correct adjacent bit errors using the various embodiments set forth below.

For loading configuration data in a device having programmable resources, the configuration circuit 110 receives the configuration bitstream, and disperses frames of configuration bits of the configuration bitstream to various configuration memory cells according to a predetermined protocol. The number of parity bits required in the Hamming code will depend upon the number of bits of the frame of configuration data, where number of parity bits is selected to enable correcting a single error in the frame. While a description of SECDEC based upon an (8,4) Hamming code is provided below for simplicity and by way of example, it should be understood that the circuits and methods could be implemented with other Hamming codes. For example, in loading an FPGA with configuration data, frames of configuration data may be generated using a 12-bit extended Hamming code having 11 parity bits and an overall parity bit to expand the function to detect double bit errors. The 12-bit expanded Hamming code enables the correction of a single error and the detection of two errors in a frame having 1300 bits of data (or a total of 1312 bits in the frame).

During readback, the ECC circuit 320 calculates a syndrome value using all the bits in the frame including the parity bits. If the bits have not changed from the original programmed values, all bits of the syndrome are zeros. If a single bit has changed, including any of the parity bits, the overall parity bit is a logical "1," and the location of the bit is indicated by all of the syndrome bits (except the most significant bit which is the overall parity bit). If two bits have changed, the most significant syndrome bit is a logical "0" and the remaining bits are non-zero. If more than two bits have changed, the syndrome bits are indeterminate. Accordingly, the overall parity bit enables the detection of two bit errors.

Figures 4, 5:
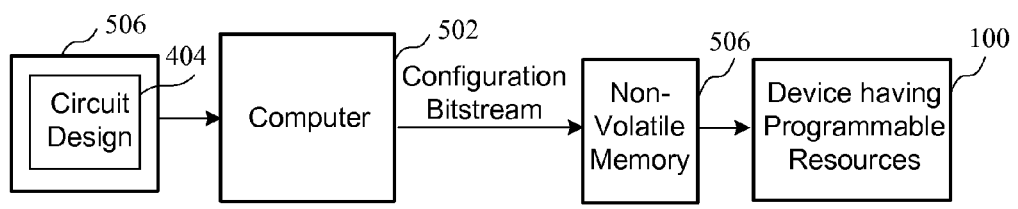
FIG. 4 is a table showing an arrangement of data bits and parity bits of an error correction code according to an embodiment.
FIG. 5 is a block diagram of a system for programming a device having programmable resources according to an embodiment.

However, according to the various embodiments, an additional parity bit is added to bitstream in order to identify adjacent bit errors. As shown in FIG. 4, an [8,4] Hamming code according to one embodiment is shown, where the four data bits and four parity bits are included. In a conventional Hamming code, all bit positions that are a power of 2 (e.g. 1, 2, 4, 8, 13, 32, etc.) are used as parity bits. All other positions are for data to be encoded. While the fourth parity bit (i.e. $p_8$) of a conventional [8,4] Hamming code would be an overall parity bit, the fourth parity bit according to the embodiment of FIG. 4 as shown would be a parity bit for the even bits of the Hamming code. That is, each parity bit calculates the parity for some of the bits in the data. The position of the parity bit determines the sequence of bits that it alternately checks and skips. As shown in FIG. 4, the parity bit in position 1 skips 0 bits, checks 1 bit, skips 1 bit, checks 1 bit, skips 1 bit, etc. The parity bit in position 2 skips 1 bit and checks 2 bits then skips 2 bits and checks 2 bits, etc. The parity bit in position 4 skips 3 bits, checks 4 bits, skips 4 bits, checks 4 bits, etc. In a conventional [8,4] arrangement the last parity bit (i.e. $p_8$ in this example) is an overall parity bit and would show an "X" for each bit position. As shown in FIG. 4, the last parity bit according to the embodiment of FIG. 4 is similar to the first parity bit which calculates parity for the odd bits, but calculates parity for the even numbered bits. In this embodiment, $p_1$ and $p_8$ represent non-overlapping sets of bit positions. More particularly, the set of bit positions of p8 is complementary to the set of bit positions of $p_1$, where the two sets represent all of the bits. As will be described in more detail below, by using one parity bit for even bits and one parity bit for odd bits, it is possible to determine that it is likely that two bit errors are in adjacent memory cells. In some embodiments, $p_8$ computes the opposite of some other parity bit. For example, using the example of FIG. 4, in another embodiment, $p_8$ would have an X for bit positions 1, 4, 5 and 8, and thus would be complementary to $p_2$. A complementary parity bit value can be computed for any parity bit by computing the exclusive-or of the parity bit with full parity, that is, the parity of all bits to be checked.

While overall parity may be necessary to determine whether two errors exist as set forth above, the inclusion of an overall parity bit in the configuration bitstream may not be necessary. That is, the overall parity can be determined by the combination of the partial overall parity bit with its complementary parity (e.g. parity bits $p_1$ and $p_8$ of the embodiment of FIG. 4), as will be described in reference to FIG. 11. Accordingly, the required number of parity bits remains the same, while still allowing the detection of two bit errors and the correction of adjacent bit errors.

The parity arrangement of FIG. 4 divides the information covered by parity into two halves comprising even and odd bit positions. If the parity value for both $p_1$ and $p_8$ of FIG. 4 (as determined by generated check bits) are incorrect, then there is a change to both a first set of bits (e.g. a set of even bits) and a second set of bits (e.g. a set of odd bits). If there are only two errors and there are errors in both an even bit and an odd bit, there is a high probability that the even bit and the odd bit having errors are adjacent bits. If the check bits indicate an error with an associated even bit or an error associated with an odd bit, then there may a single bit in error which may be corrected using the generated syndrome. The controller core 302 can then test for adjacent errors, as will be described in more detail below in reference to FIGS. 15-17. That is, while it may be a difficult task to correct two errors which may be at any two locations of a frame of data, determining that the two bit errors may be adjacent bit errors enables detecting the location of the adjacent bit errors according to the various methods set forth below.

According to another error detection technique called a cyclic redundancy check (CRC), the number of errors even greater than two can be identified. CRC is used to protect blocks of data or frames. In performing a CRC, a transmitter apends an extra n-bit sequence called a Frame Check Sequence (FCS) to every frame. The FCS holds redundant information about the frame that helps the transmitter detect errors in the frame. While a CRC provides no indication as to the location of the errors, a CRC circuit may be used to provide additional information related to the number of errors that exist. For example, errors less than or equal to 32 can be detected using of a 32 bit running CRC. An example of a CRC generator is described in U.S. Pat. No. 5,598,424, granted on Jan. 28, 1997 to the assignee of the present application, the entire patent of which is also incorporated by reference.

Before describing the correction of adjacent bits in a memory storing configuration data, the generation and storing of configuration data in a memory array will be described in reference to FIGS. 5 and 6. Referring first to FIG. 5, a block diagram of a system for programming a device having programmable resources according to an embodiment is shown. In particular, a computer 502 is coupled to receive a circuit design 504 from a memory 506, and generate a configuration bitstream which is stored in the non-volatile memory 506. As will be described in more detail below, the circuit design may be a high level design, such as a circuit design defined in a hardware description language (HDL). Also, the computer may be configured to run software that generates a configuration bitstream which is stored in the non-volatile memory 506.

The software flow for a circuit design to be implemented in a programmable integrated circuit comprises synthesis, packing, placement and routing, as is well known in the art. Synthesis comprises the step of converting a circuit design in a high level design to a configuration of elements found in the programmable integrated circuit. For example, a synthesis tool operated by the computer 502 may implement the portions of a circuit design implementing certain functions in configurable logic blocks (CLBs) or digital signal processing (DSP) blocks, for example. An example of a synthesis tool is the ISE tool available from Xilinx, Inc. of San Jose Calif. Packing comprises the step of grouping portions of the circuit design into defined blocks of the device, such as CLBs. Placing comprises the step of determining the location of the blocks of the device defined during the packing step. Finally, routing comprises selecting paths of interconnect elements, such as programmable interconnects, in a programmable integrated circuit. At the end of place and route, all functions, positions and connections are known, and a configuration bitstream is then created. The bitstream may be created by a software module called BitGen, available from Xilinx, Inc. of San Jose, Calif. The bitstream is either downloaded by way of a cable or programmed into an EPROM for delivery to the programmable integrated circuit.

Figure 6:
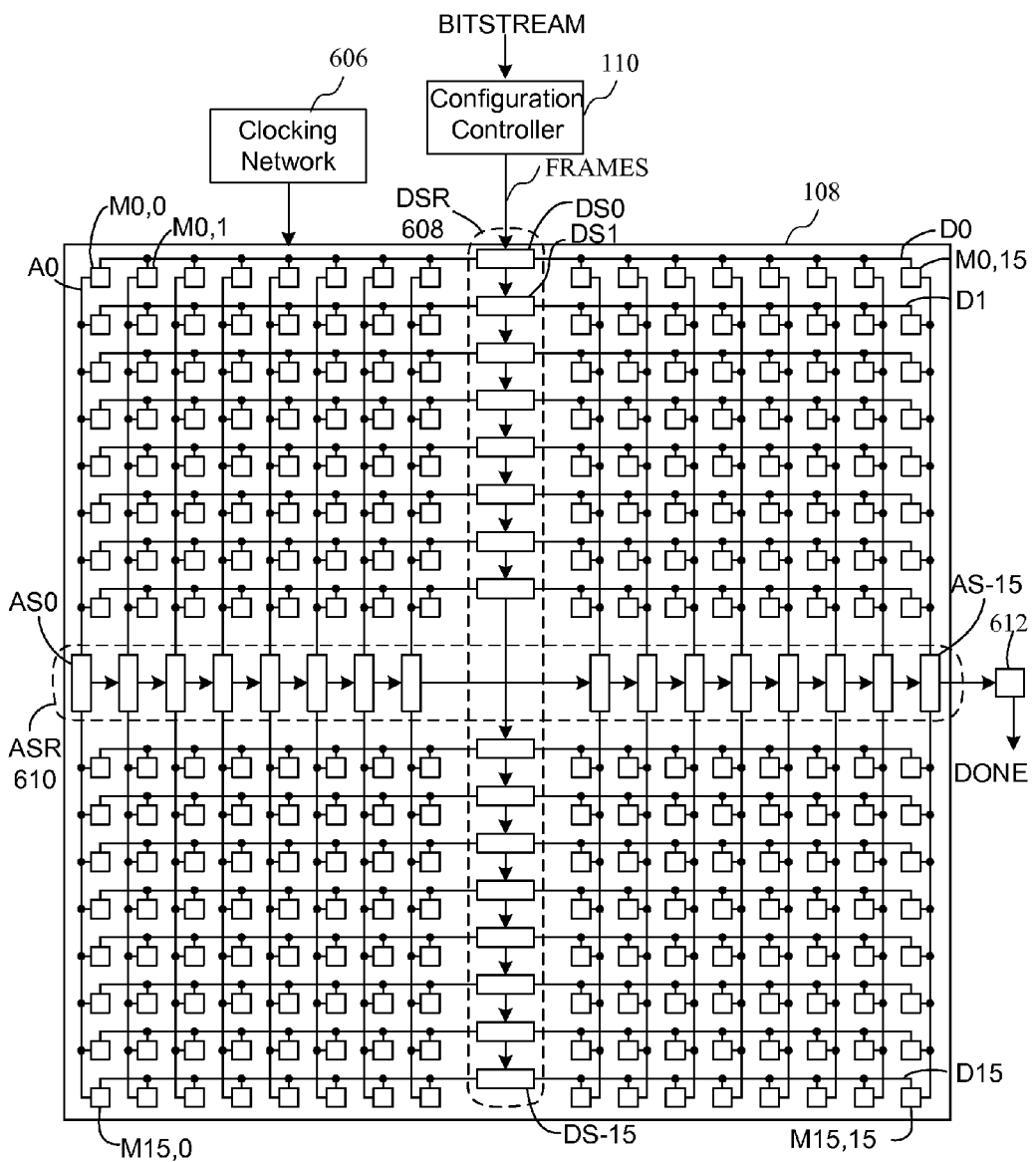
FIG. 6 is a block diagram of a circuit enabling the configuration of a device having programmable resources according to an embodiment.

Turning now to FIG. 6, a block diagram of a circuit enabling the configuration of a programmable integrated circuit, and more particularly loading frames of data, according to an embodiment is shown. The circuit of FIG. 6 generally comprises the configuration circuit 110 and the configuration memory 108 coupled to receive the configuration bits. The configuration controller 110 receives the bitstream, and disperses frames of configuration bits of the bitstream to various configuration memory cells according to a predetermined protocol using a clocking network 606. The configuration controller 110 enables loading the configuration bitstream by way of a central data shift register (DSR) 608. DSR 608 is a length of a frame of configuration data, which will be the fundamental data item transferred. As shown in FIG. 6, the DSR 608, which is connected in parallel to all cells of the configuration memory, captures a frame. The DSR 608 outputs connect to the parallel inputs of the various configuration memory cells in the rows. The configuration process enables extracting frames of data from the incoming bitstream, identifying the correct columns to receive the frames, dispatch them until all of the frames have been loaded.

The configuration memory 108 is shown by way of example of FIG. 6 as a 16-bit by 16-bit array, which includes 256 configuration memory cells. In general, each of the configuration memory cells is identified by a reference character Mx, y, where x and y correspond to the row and column, respectively, of the configuration memory cell. To load configuration data into the configuration memory 604, the configuration bitstream is shifted through the DSR 608 under control of the clocking network 606 until a 16 bit wide frame of data has been shifted into bit positions DS0 through DS15 of the DSR 608. The frame of data is then shifted in parallel on data lines D0 through D15 into a column of configuration memory cells addressed by address shift register (ASR) 610. The column may be addressed, for example, by shifting a token high bit through the ASR 610 to the desired column. When all of the frames have been loaded, a circuit 612 is activated to generate the DONE signal. The DSR 608 and ASR 610 which are shown circled in dashed lines and the circuit 612 may be a part of the configuration controller 110. An array of configuration memory cells in a typical device has on the order of millions of memory cells. Therefore, the array of FIG. 6 is much smaller than is typically used, but nevertheless shows the structure of an array of memory cells of a configuration memory which could be employed according to the various embodiments. However, it should be understood that other arrangements of memory cells or circuits for loading configuration data in memory cells could be employed.

Figure 7:
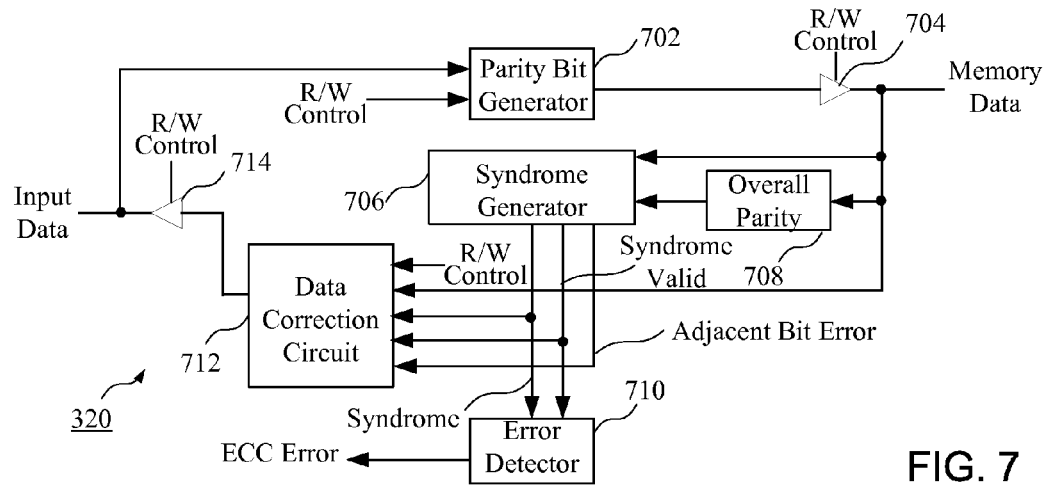
FIG. 7 is a block diagram of an error correction code (ECC) circuit according to an embodiment.

Turning now to FIG. 7, a block diagram of an error correction code circuit according to an embodiment is shown. The detection and identification of errors may be performed utilizing the ECC circuit 320. The ECC circuit 320 enables determining a location of a bit error in a frame of data stored in the configuration memory. The ECC circuit 320 uses modified SECDED parity values, as set forth above in reference to FIG. 4, based on frames of data. That is, parity bits are calculated for, and embedded into, each frame of configuration memory during bitstream generation. The ECC circuit 320 calculates a syndrome value using all the bits in the frame of data, including the parity bits, read back from memory. The syndrome indicates whether an error occurred, and either the location of the error within the frame for single bit errors, or an indication that a double-bit error has occurred. More importantly, the syndrome indicates whether adjacent bit errors may be present by evaluating the parity bits associated with two sets of non-overlapping data.

The ECC circuit 320 consists of a data bus for receiving input data, a read/write (R/W) control signal, and an error flag signal, ECC error. The ECC circuit enables reading data from or writing data to the configuration memory in response to the R/W control signal which switches the integrated circuit between read and write cycles. A parity bit generator 702 creates parity bits which are stored with the data bits from the controller core 302 during a write cycle. The parity bit generator 702 as will be described in more detail in reference to FIG. 8. In a read cycle, the syndrome generator 706 generates a syndrome[3:0] comprising check bits based upon the memory data read from the memory.

An overall parity bit will be generated by an overall parity circuit 708, as will be described in detail in reference to FIG. 11. An error detector 710 generates the ECC error signal based on the syndrome and overall parity bit. Corrected data to be restored in the event a single bit error or double error comprising adjacent bits is output by a Data Correction circuit 712. The data correction circuit 712 may be configured in programmable resources or in a dedicated processor or other logic to implement the steps for correcting data set forth below in FIGS. 15-17. More particularly, the data correction circuit 712 receives the R/W control signal and the Memory Data read from the configuration memory to correct the data stored in the memory if an error is detected. A Syndrome Valid signal is used to sample the syndrome[3:0] outputs. An ECC Error signal is generated when the syndrome valid signal is active, and indicates whether a frame error is detected. That is, the ECC Error signal will indicate that no error is detected when the syndrome[3:0] is all zeros, and will indicate an error when syndrome[3:0] is non-zero. More particularly, when the syndrome valid is active, the syndrome[3:0] the frame error condition as having no bit errors (i.e. [3]==0, [2:0]==0), one bit error (i.e. [3]==1, [2:0]!=0), two bit errors (i.e. [3]==0, [2:0]!=0), more than two bit errors (i.e. the syndrome is unpredictable), a parity bit error (i.e. [3]==1, [2:0]==0).

During operation a frame is read out through ICAP and stored in block RAM. The frame address is generated as each frame is read. If an error is indicated by the error output of the ECC circuit 320, the reading back of data is halted and the SYNDROME value is saved to enable error correction. The repaired frame is then written back into the frame address previously generated. Reading back of data then resumed on the next frame address, where the frames are continuously read back to correct errors as they are detected.

Figure 8:
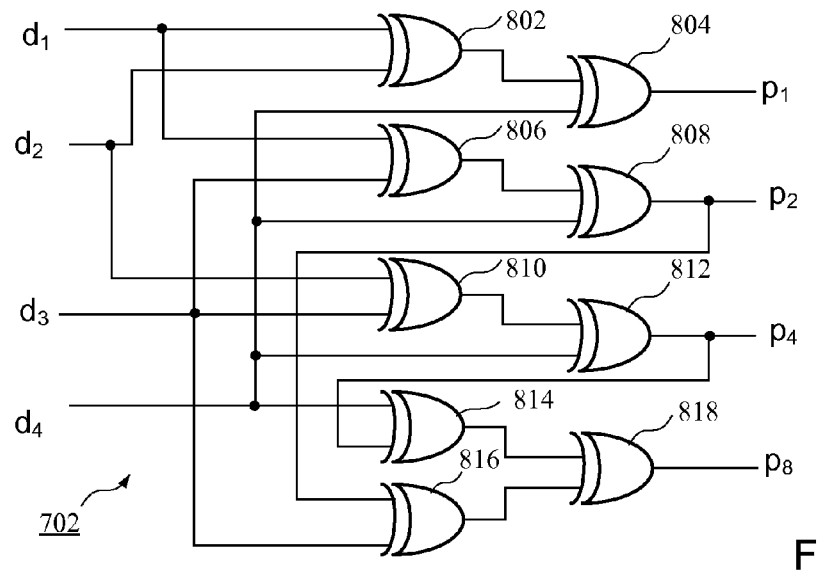
FIG. 8 is a block diagram of a parity bit generator according to an embodiment.

Turning now to FIG. 8, a block diagram of a parity bit generator according to an embodiment is shown. In particular, the circuit of FIG. 8 includes an arrangement of XOR gates which generate the parity bits based upon the embodiments of FIG. 4 as shown. A first series of XOR gates 802 and 804 is coupled to generate the first parity bit $p_1$. The XOR gate 802 is coupled to receive $d_1$ and $d_2$ as inputs, and an output of the XOR gate 802 is coupled to an input of the XOR gate 804, which is also coupled to receive $d_4$. A second series of XOR gates 806 and 808 is coupled to generate the second parity bit $p_2$. The XOR gate 806 is coupled to receive $d_1$ and $d_3$ as inputs, and an output of the XOR gate 806 is coupled to an input of the XOR gate 808, which is also coupled to receive $d_4$. A third series of XOR gates 810 and 812 is coupled to generate the third parity bit $p_4$. The XOR gate 810 is coupled to receive $d_2$ and $d_3$ as inputs, and an output of the XOR gate 810 is coupled to an input of the XOR gate 812, which is also coupled to receive $d_4$. A fourth arrangement of XOR gates 814, 816 and 818 are coupled to generate the fourth parity bit $p_8$. The XOR gate 814 is coupled to receive $d_4$ and $p_4$ as inputs, and the XOR gate 816 is coupled to receive $d_3$ and $p_2$ as inputs. The outputs of the XOR gates 814 and 816 are coupled to the inputs of XOR gate 818, which generates $p_8$.

Figure 9:
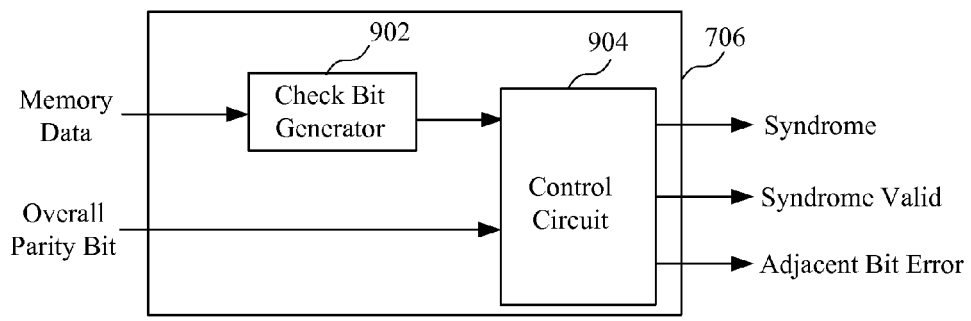
FIG. 9 is a block diagram of a syndrome generator according to an embodiment.

Turning now to FIG. 9, a block diagram of a syndrome generator according to an embodiment is shown. In particular, a check bit generator 902 receives stored data which is read back from memory, and generates check bits. A control circuit 904 is coupled to receive the output of the check bit generator 902 and the overall parity bit. Based upon the inputs, the control circuit 908 will generate a syndrome as well as an Adjacent Bit Error signal. The syndrome is based upon the output of the check bit generator, where the overall parity bit is generated and used to determine whether there are two bit errors in the data. An Adjacent Bit Error signal is also generated based upon the check bits $c_1$ and $c_8$ associated with first and second sets of bits, respectively, read from memory. If check bits $c_1$ and $c_8$ indicate an error in both the first and second sets of bits, such as an even and an odd bit in the embodiment of FIG. 4 as shown, it will be assumed that the two errors may be adjacent bit errors. Therefore, the control circuit generates the Adjacent Bit Error signal indicating that there may be adjacent bit errors.

The Adjacent Bit Error signal may be generated based upon coupling the check bits $c_1$ and $c_8$ associated with odd and even bits to an AND gate. If both the check bits $c_1$ and $c_8$ associated with non-overlapping sets of data indicate an error, the Adjacent Bit Error signal will indicate that there may be adjacent bit errors. The control circuit 904 also generates the Syndrome Valid signal which is used to sample the syndrome based upon a clock signal generated within the integrated circuit. As will be described in more detail below in reference to FIGS. 15-17, the data correction circuit 712 will attempt to correct the two errors which may be adjacent bit errors if an active Adjacent Bit Error signal is generated.

Figure 10:
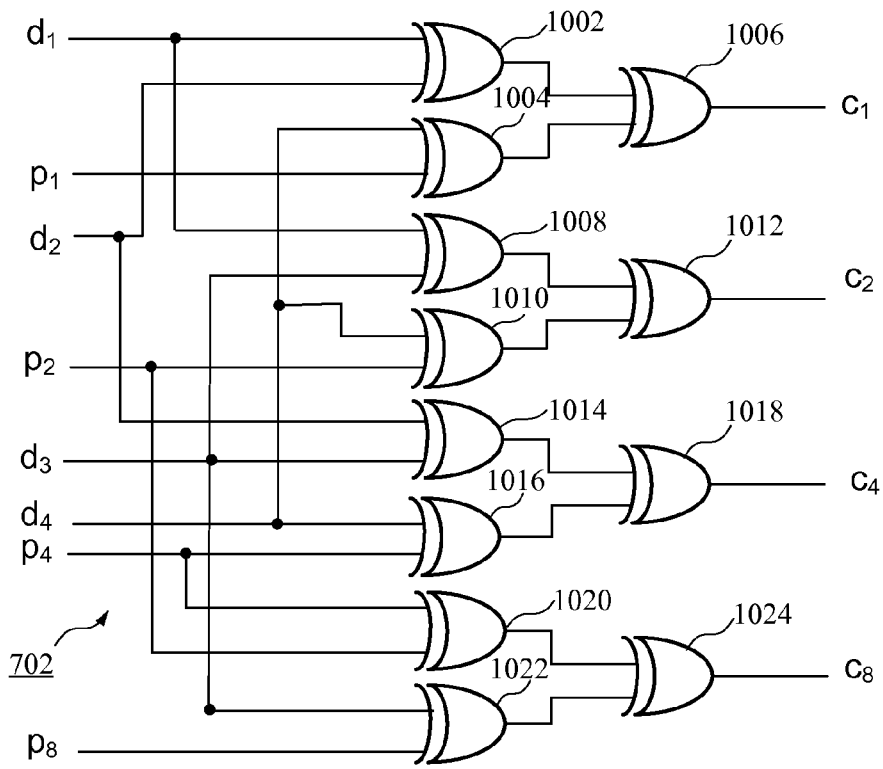
FIG. 10 is a block diagram of a check bit generator according to an embodiment.

The block diagram of a check bit generator of FIG. 10 is similar to the parity bit generator of FIG. 8, except that the inputs for each stage which generates the check bit $c_1$, $c_2$, $c_4$, and $c_8$ receives the corresponding parity bit $p_1$, $p_2$, $p_4$, and $p_8$ at an XOR gate. In particular, a first arrangement of XOR gates 1002, 1004 and 1006 are coupled to generate the first check bit $c_1$. The XOR gate 1002 is coupled to receive $d_1$ and $d_2$ as inputs. The XOR gate 1004 is coupled to receive $p_1$ and $d_4$ as inputs. The outputs of the XOR gates 1002 and 1004 are coupled to the inputs of the XOR gate 1006, which generates the first check bit $c_1$. A second arrangement of XOR gates 1008, 1010 and 1012 are coupled to generate the second check bit $c_2$. The XOR gate 1008 is coupled to receive $d_1$ and $d_3$ as inputs. The XOR gate 1010 is coupled to receive $p_2$ and $d_4$ as inputs. The outputs of the XOR gates 1008 and 1010 are coupled to the inputs of the XOR gate 1012, which generates the second check bit $c_2$. A third arrangement of XOR gates 1014, 1016 and 1018 are coupled to generate the third check bit $c_4$. The XOR gate 1014 is coupled to receive $d_2$ and $d_3$ as inputs. The XOR gate 1016 is coupled to receive $p_4$ and $d_4$ as inputs. The outputs of the XOR gates 1014 and 1016 are coupled to the inputs of the XOR gate 1018, which generates the third check bit $c_4$. A fourth arrangement of XOR gates 1020, 1022 and 1024 are coupled to generate the fourth check bit $c_8$. The XOR gate 1020 is coupled to receive $p_2$ and $p_4$ as inputs. The XOR gate 1022 is coupled to receive $p_8$ and $d_3$ as inputs. The outputs of the XOR gates 1020 and 1022 are coupled to the inputs of the XOR gate 1024, which generates the first check bit $c_8$. Accordingly, each check bit $c_1$-$c_4$ is generated based upon data bits and a parity bit including at least the corresponding parity bit.

Figure 11:
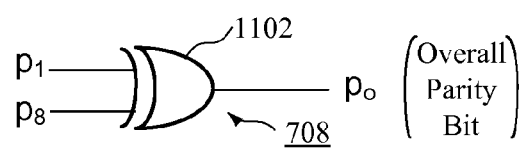
FIG. 11 is a block diagram of a circuit for generating an overall parity bit according to an embodiment.

Turning now to FIG. 11, a block diagram of a circuit for generating an overall parity bit according to an embodiment is shown. As set forth above, it is necessary to generate an overall parity bit which is required to determine that there are two errors in the data. Accordingly, the XOR gate 1102 is coupled to receive the parity bits $p_1$ and $p_8$ associated with non-overlapping sets of bits to generate an overall parity bit $p_o$. The overall parity bit generated by the XOR circuit 1102 will correspond to an overall parity used in a conventional [8,4] Hamming Code. That is, the overall parity bit is necessary to determine whether there are two errors, which would be necessary to determine whether there are adjacent bit errors.

Figure 12:
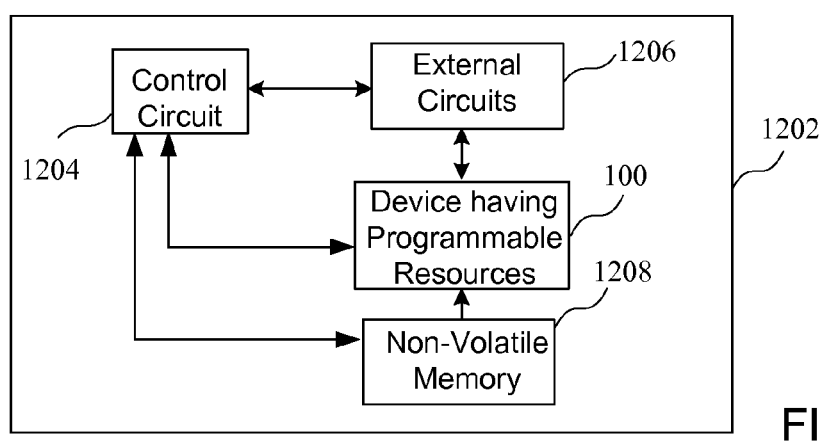
FIG. 12 is a block diagram of a circuit having an integrated circuit 100 of FIG. 1 according to an embodiment.

Turning now to FIG. 12, a block diagram of a circuit having an integrated circuit comprising the circuit of FIG. 1 according to an embodiment is shown. The circuit 1202, which may be a circuit board, for example, has a control circuit 1204. The control circuit 1204 may be, for example, a microprocessor or other integrated circuit for controlling external circuits 1206, integrated circuit 100, and a non-volatile memory 1208. Depending upon the type of device employing programmable logic which is used, the control circuit 1204 may be implemented on the integrated circuit 100. By allowing users to read back data from memory cells, it is possible to correct data of a programmable logic device of the integrated circuit 100 as described above. That is, board-level devices external to the integrated circuit 100, such as external circuits 1206, may enable an external read back and correction of data stored in a memory of the integrated circuit. While the examples provided below relate to reading configuration bits back from a memory of an integrated circuit, it would be understood that the circuits and methods of correcting adjacent bit errors in a memory could be implemented with data stored in any type of memory.

Figure 13:
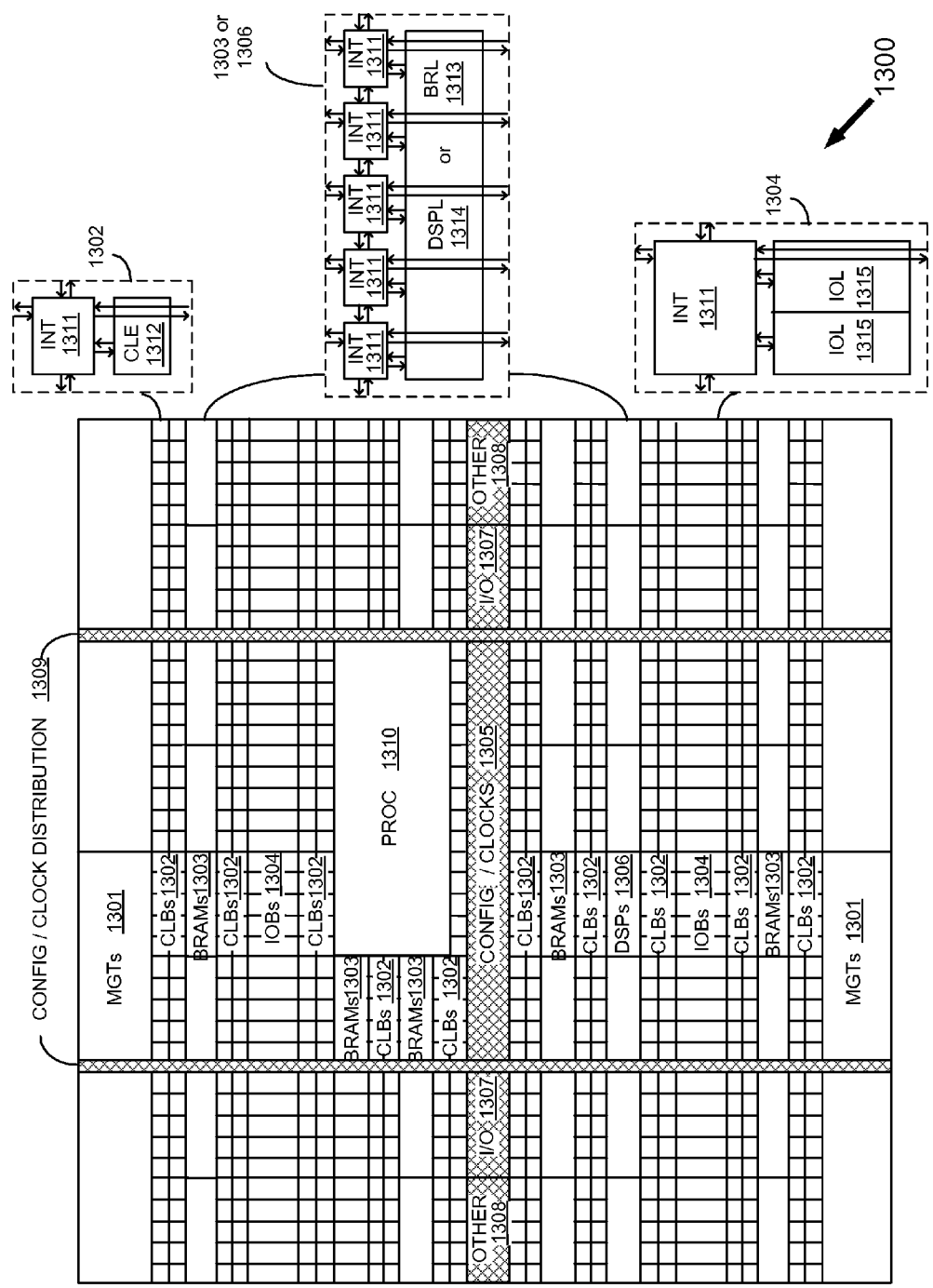
FIG. 13 is a block diagram of a device having programmable resources according to an embodiment.

Turning now to FIG. 13, a block diagram of a device having programmable resources according to an embodiment is shown. While devices having programmable resources may be implemented in any type of integrated circuit device, such as an application specific integrated circuit (ASIC) having programmable resources, other devices comprise dedicated programmable logic devices (PLDs). One type of PLD is the Complex Programmable Logic Device (CPLD). A CPLD includes two or more "function blocks" connected together and to input/output (I/O) resources by an interconnect switch matrix. Each function block of the CPLD includes a two-level AND/OR structure similar to that used in a Programmable Logic Array (PLA) or a Programmable Array Logic (PAL) device. Another type of PLD is a field programmable gate array (FPGA). In a typical FPGA, an array of configurable logic blocks (CLBs) is coupled to programmable input/output blocks (IOBs). The CLBs and IOBs are interconnected by a hierarchy of programmable routing resources. These CLBs, IOBs, and programmable routing resources are customized by loading a configuration bitstream, typically from off-chip memory, into configuration memory cells of the FPGA. For both of these types of programmable logic devices, the functionality of the device is controlled by configuration data bits of a configuration bitstream provided to the device for that purpose. The configuration data bits may be stored in volatile memory (e.g., static memory cells, as in FPGAs and some CPLDs), in non-volatile memory (e.g., flash memory, as in some CPLDs), or in any other type of memory cell.

PLDs also have different "modes" depending on the operations being performed on them. A specific protocol allows a programmable logic device to enter into the appropriate mode. Typical PLDs have internal blocks of configuration memory which specify how each of the programmable cells will emulate the user's logic. During a "program" mode, a configuration bitstream is provided to non-volatile memory, such as a read-only memory (ROM) (e.g. a programmable ROM (PROM), an erasable PROM (EPROM), an electrically erasable PROM (EEPROM)) either external or internal to the programmable logic device. Each address is typically accessed by specifying its row and column addresses. During system power up of a "startup" mode, the configuration bits are successively loaded from the non-volatile memory into static random access memory (SRAM) configuration latches of a configuration logic block. Configuration bitstreams are typically loaded in frames, where the frames are no larger than the depth of a memory. For example, the frame would be no larger than N for an N×N memory array. At the end of this start-up phase, the PLD is now specialized to the user's design, and the PLD enters into "user" mode as part of its normal operation.

The device of FIG. 13 comprises an FPGA architecture 1300 having a large number of different programmable tiles including multi-gigabit transceivers (MGTs) 1301, CLBs 1302, random access memory blocks (BRAMs) 1303, input/output blocks (IOBs) 1304, configuration and clocking logic (CONFIG/CLOCKS) 1305, digital signal processing blocks (DSPs) 1306, specialized input/output blocks (I/O) 1307 (e.g., configuration ports and clock ports), and other programmable logic 1308 such as digital clock managers, analog-to-digital converters, system monitoring logic, and so forth. Some FPGAs also include dedicated processor blocks (PROC) 1310, which may be used to implement a software application, for example.

In some FPGAs, each programmable tile includes a programmable interconnect element (INT) 1311 having standardized connections to and from a corresponding interconnect element in each adjacent tile. Therefore, the programmable interconnect elements taken together implement the programmable interconnect structure for the illustrated FPGA. The programmable interconnect element 1311 also includes the connections to and from the programmable logic element within the same tile, as shown by the examples included at the top of FIG. 13.

For example, a CLB 1302 may include a configurable logic element (CLE) 1312 that may be programmed to implement user logic plus a single programmable interconnect element 1311. A BRAM 1303 may include a BRAM logic element (BRL) 1313 in addition to one or more programmable interconnect elements. The BRAM includes dedicated memory separate from the distributed RAM of a configuration logic block. Typically, the number of interconnect elements included in a tile depends on the height of the tile. In the pictured embodiment, a BRAM tile has the same height as five CLBs, but other numbers may also be used. A DSP tile 1306 may include a DSP logic element (DSPL) 1314 in addition to an appropriate number of programmable interconnect elements. An IOB 1304 may include, for example, two instances of an input/output logic element (IOL) 1315 in addition to one instance of the programmable interconnect element 1311. The location of connections of the device is controlled by configuration data bits of a configuration bitstream provided to the device for that purpose. The programmable interconnects, in response to bits of a configuration bitstream, enable connections comprising interconnect lines to be used to couple the various signals to the circuits implemented in programmable logic, or other circuits such as BRAMs or the processor.

In the pictured embodiment, a columnar area near the center of the die is used for configuration, clock, and other control logic. Horizontal areas 1309 extending from this column are used to distribute the clocks and configuration signals across the breadth of the FPGA. Some FPGAs utilizing the architecture illustrated in FIG. 13 include additional logic blocks that disrupt the regular columnar structure making up a large part of the FPGA. The additional logic blocks may be programmable blocks and/or dedicated logic. For example, the processor block PROC 1310 shown in FIG. 13 spans several columns of CLBs and BRAMs.

Note that FIG. 13 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the top of FIG. 13 are purely exemplary. For example, in an actual FPGA more than one adjacent column of CLBs is typically included wherever the CLBs appear in order to facilitate the efficient implementation of user logic.

Figure 14:
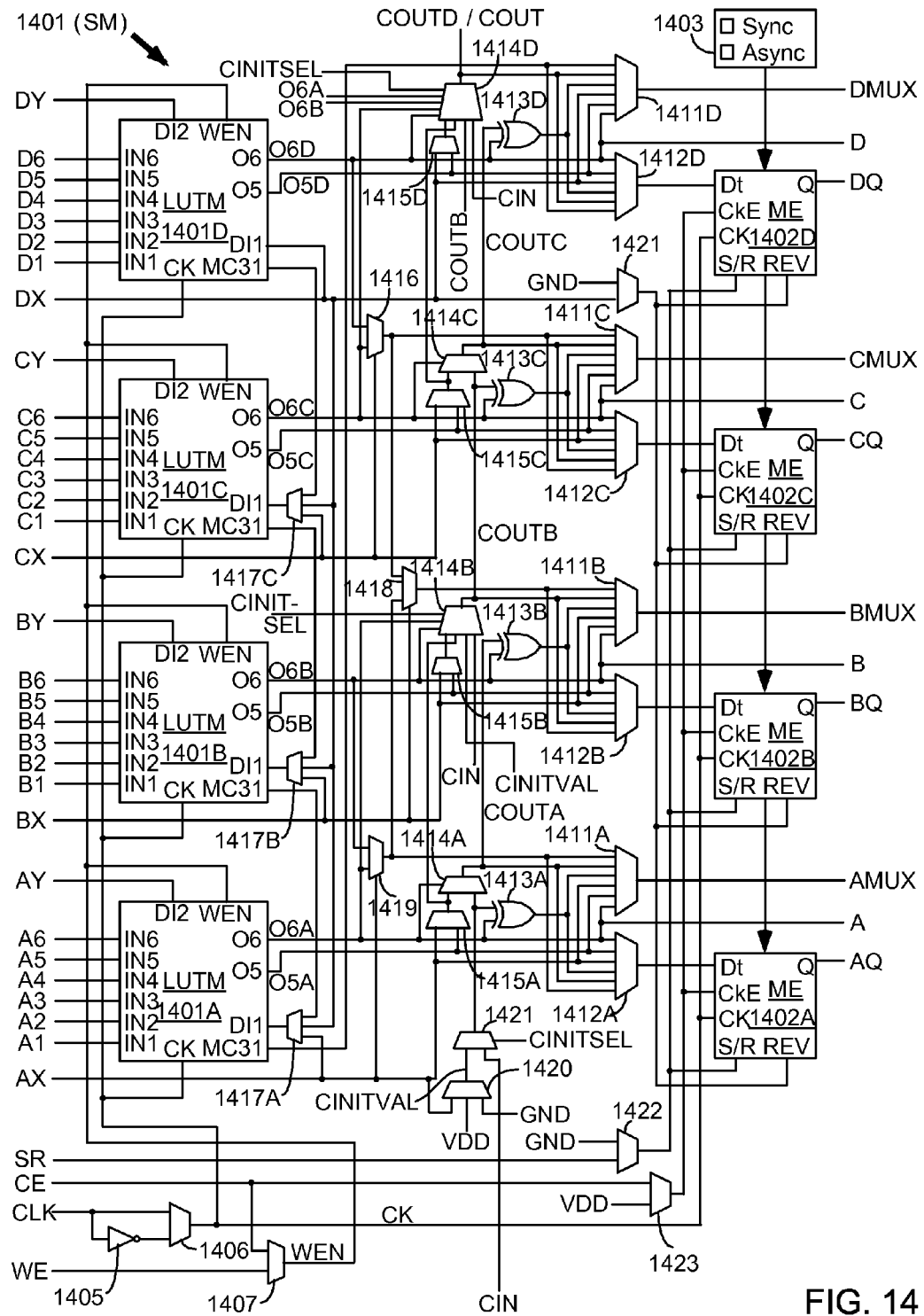
FIG. 14 is a block diagram of a configurable logic element according to an embodiment.

Turning now to FIG. 14, a block diagram of a configurable logic element according to an embodiment is shown. In particular, FIG. 14 illustrates in simplified form a configurable logic element of a configuration logic block 1302 of FIG. 13.

In the embodiment of FIG. 14, slice M 1401 includes four lookup tables (LUTMs) 1401A-1401D, each driven by six LUT data input terminals A1-A6, B1-B6, C1-C6, and D1-D6 and each providing two LUT output signals O5 and O6. The O6 output terminals from LUTs 1401A-1401D drive slice output terminals A-D, respectively. The LUT data input signals are supplied by the FPGA interconnect structure via input multiplexers, which may be implemented by programmable interconnect element 1411, and the LUT output signals are also supplied to the interconnect structure. Slice M also includes: output select multiplexers 1411A-1411D driving output terminals AMUX-DMUX; multiplexers 1412A-1412D driving the data input terminals of memory elements 1402A-1402D; combinational multiplexers 1416, 1418, and 1419; bounce multiplexer circuits 1422-1423; a circuit represented by inverter 1405 and multiplexer 1406 (which together provide an optional inversion on the input clock path); and carry logic having multiplexers 1414A-1414D, 1415A-1415D, 1420-1421 and exclusive OR gates 1413A-1413D. All of these elements are coupled together as shown in FIG. 14. Where select inputs are not shown for the multiplexers illustrated in FIG. 14, the select inputs are controlled by configuration memory cells. That is, configuration bits of the configuration bitstream stored in configuration memory cells are coupled to the select inputs of the multiplexers to select the correct inputs to the multiplexers. These configuration memory cells, which are well known, are omitted from FIG. 14 for clarity, as well as from other selected figures herein.

In the pictured embodiment, each memory element 1402A-1402D may be programmed to function as a synchronous or asynchronous flip-flop or latch. The selection between synchronous and asynchronous functionality is made for all four memory elements in a slice by programming Sync/Asynch selection circuit 1403. When a memory element is programmed so that the S/R (set/reset) input signal provides a set function, the REV input terminal provides the reset function. When the memory element is programmed so that the S/R input signal provides a reset function, the REV input terminal provides the set function. Memory elements 1402A-1402D are clocked by a clock signal CK, which may be provided by a global clock network or by the interconnect structure, for example. Such programmable memory elements are well known in the art of FPGA design. Each memory element 1402A-1402D provides a registered output signal AQ-DQ to the interconnect structure. Because each LUT 1401A-1401D provides two output signals, O5 and O6, the LUT may be configured to function as two 5-input LUTs with five shared input signals (IN1-IN5), or as one 6-input LUT having input signals IN1-IN6.

In the embodiment of FIG. 14, each LUTM 1401A-1401D may function in any of several modes. When in lookup table mode, each LUT has six data input signals IN1-IN6 that are supplied by the FPGA interconnect structure via input multiplexers. One of 64 data values is programmably selected from configuration memory cells based on the values of signals IN1-IN6. When in RAM mode, each LUT functions as a single 64-bit RAM or two 32-bit RAMs with shared addressing. The RAM write data is supplied to the 64-bit RAM via input terminal DI1 (via multiplexers 1417A-1417C for LUTs 1401A-1401C), or to the two 32-bit RAMs via input terminals DI1 and DI2. RAM write operations in the LUT RAMs are controlled by clock signal CK from multiplexer 1406 and by write enable signal WEN from multiplexer 1407, which may selectively pass either the clock enable signal CE or the write enable signal WE. In shift register mode, each LUT functions as two 16-bit shift registers, or with the two 16-bit shift registers coupled in series to create a single 32-bit shift register. The shift-in signals are provided via one or both of input terminals DI1 and DI2. The 16-bit and 32-bit shift out signals may be provided through the LUT output terminals, and the 32-bit shift out signal may also be provided more directly via LUT output terminal MC31. The 32-bit shift out signal MC31 of LUT 1401A may also be provided to the general interconnect structure for shift register chaining, via output select multiplexer 1411D and CLE output terminal DMUX. Accordingly, the methods may be implemented in a device such as the FPGA of FIGS. 13 and 14, or any other suitable device.

Figure 15:
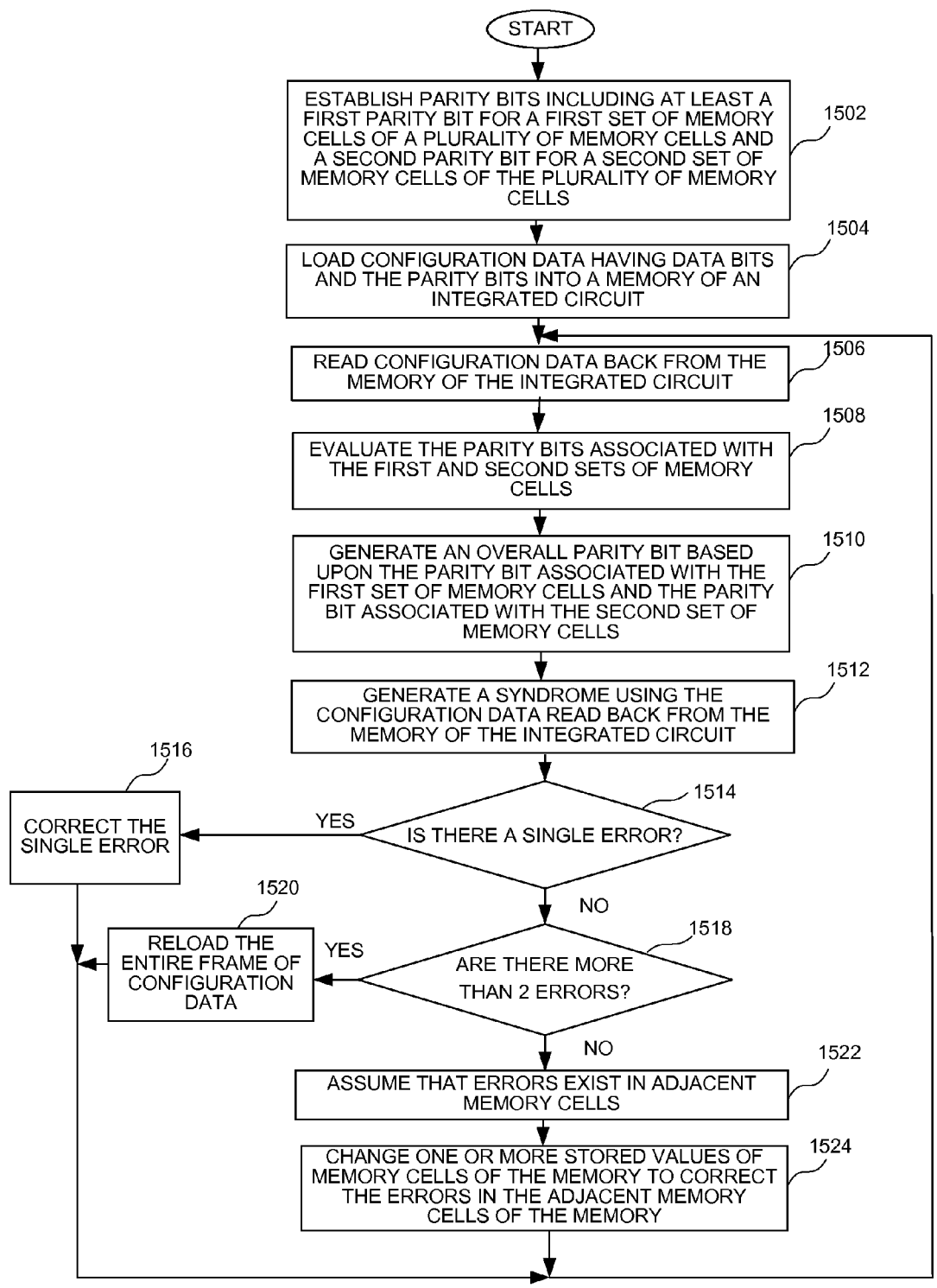
FIG. 15 is a flow chart showing a method of correcting adjacent bit errors in a memory according to an embodiment.

Specific methods of detecting and correcting bit errors in adjacent bits of a memory will now be described in reference to FIGS. 15-17. As set forth above, the adjacent bits could be detected using the syndrome generator 706, while the bit errors could be corrected using the data correction circuit 712. However, it should be understood that other suitable circuits could be employed to implement the methods of FIGS. 15-17. Turning first to FIG. 15, a flow chart shows a method of correcting adjacent bit errors in a memory according to an embodiment. In particular, parity bits including at least a first parity bit for a first set of memory cells of a plurality of memory cells and a second parity bit for a second set of memory cells of the plurality of memory cells are established at a step 1502. Configuration data having data bits and the parity bits are loaded into a memory of an integrated circuit at a step 1504. The configuration data is read back from the memory of the integrated circuit at a step 1506. The parity bits associated with each of the first set of memory cells and the second set of memory cells are evaluated at a step 1508. That is, the parity bits associated with the first and second sets of memory cells is evaluated to determine whether adjacent bit errors may exist. An overall parity bit based upon a parity bit associated with the first set of memory cells and a parity bit associated with the second set of memory cells is generated at a step 1510. A syndrome is generated using the configuration data read back from the memory of the integrated circuit at a step 1512.

It is then determined whether there is a single error in the data bit at a step 1514. If so, the single error is corrected using a syndrome generated by the data read back from memory, as set forth above, at a step 1516. If not, it is determined whether there are more than two errors at a step 1518. If so, the entire frame of configuration data is reloaded at a step 1520. If any error is not a single error and there are no more than two errors, then it is assumed that the errors exist in adjacent memory cells at a step 1522. Accordingly, one or more stored values of memory cells of the memory are changed to correct the errors in the adjacent memory cells of the memory. The configuration data is then read back from the memory again at the step 1506. Frames of data could be read back, where the next frame of data would be read as described above, until all frames of data have been read. As set forth above, the frames could then be continuously read.

Figure 16:
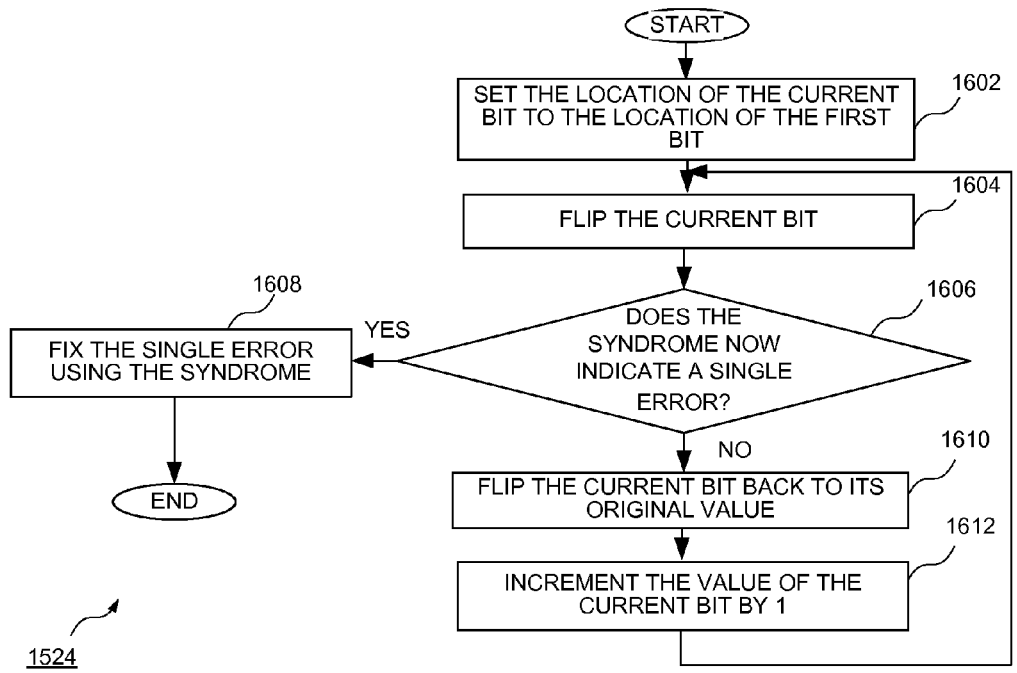
FIG. 16 is a flow chart showing a method of identifying the location of an error in a memory while correcting adjacent bit errors according to an embodiment.

Turning now to FIG. 16, a flow chart shows a method of identifying the location of an error in a memory at the step 1524 of FIG. 15 according to an embodiment. The location of the current bit is set to the location of the first bit at a step 1602. The current bit is then flipped at a step 1604, and it is then determined whether the syndrome now indicates a single error at a step 1606. If so, the single error is fixed using the syndrome at a step 1608. Alternatively, the single error could be corrected by flipping a bit adjacent to the first error could be flipped. Otherwise, the current bit is flipped back to its original value at a step 1610, and the value of the current bit is incremented by 1 at a step 1612. The process continues until the errors in the adjacent memory elements are identified.

That is, a bit is selectively flipped until a first error is found, and remaining single error is corrected.

Figure 17:
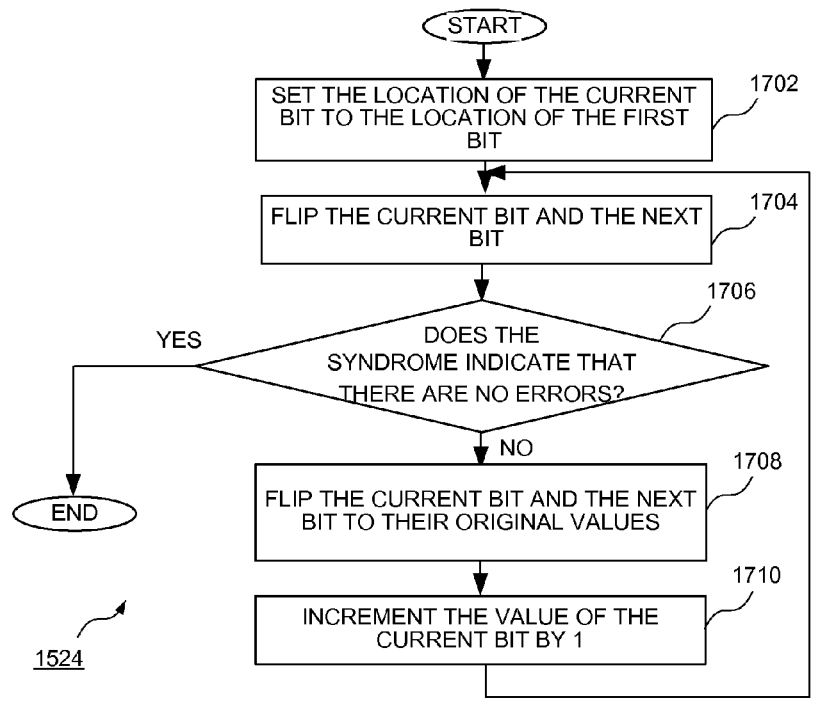
FIG. 17 is a flow chart showing a method of identifying the location of an error in a memory while correcting adjacent bit errors according to an alternate embodiment.

Turning now to FIG. 17, a flow chart shows a method of identifying the location of an error in a memory at the step 1524 of FIG. 15 according to an alternate embodiment. The location of the current bit is set to the location of the first bit at a step 1702. The current bit and the next bit are both flipped at a step 1704. It is then determined whether the syndrome indicates that there are no errors at a step 1706. If there are no errors, the errors would have been found and corrected by flipping two adjacent bits. Otherwise, the current bit and the next bit are flipped back to their original values at a step 1708, and the value of the current bit is incremented by 1 at a step 1710. Accordingly, two bits are changed using the method of FIG. 17, where the adjacent bits will be corrected when the bits having the two errors are flipped, and the syndrome is not necessary to correct an error.

It can therefore be appreciated that the new and novel method of and circuit for correcting adjacent errors in a memory has been described. It will be appreciated by those skilled in the art that numerous alternatives and equivalents will be seen to exist which incorporate the disclosed invention. As a result, the invention is not to be limited by the foregoing embodiments, but only by the following claims.

What is claimed is:

1. A method of correcting adjacent bit errors in a memory, the method comprising:
   determining that there are errors in each set of two non-overlapping sets of memory cells of the memory;
   changing a stored value of a memory cell of the memory until it is determined that a single error exists in the two non-overlapping sets of memory cells;
   identifying a location of the single error in the two non-overlapping sets of memory cells; and
   correcting the single error in the two non-overlapping sets of memory cells.

2. The method of claim 1, wherein identifying a location of the single error in the two non-overlapping sets of memory cells comprises selecting a first memory cell adjacent to the memory cell having the stored value which was changed.

3. The method of claim 2, wherein correcting the single error in the memory comprises changing a stored value of the first memory cell.

4. The method of claim 3, further comprising selecting, if the single error in the memory is not corrected by changing the stored value in the first memory cell, a second memory cell adjacent to the memory cell having the stored value which was changed.

5. The method of claim 1, further comprising establishing a first parity bit associated with a first set of the two non-overlapping sets of memory cells and a second parity bit associated with a second set of the two non-overlapping sets of memory cells.

6. The method of claim 5, further comprising determining that there are errors in two memory cells of the memory.

7. The method of claim 1, wherein identifying a location of the single error in the two non-overlapping sets of memory cells comprises evaluating an error correction code after changing the stored value of the memory cell of the memory until it is determined that the single error is present in the memory.

8. A method of correcting adjacent bit errors in a memory, the method comprising:
   establishing a first parity bit for a first set of memory cells of two non-overlapping sets of memory cells;
   establishing a second parity bit for a second set of memory cells of the two non-overlapping sets of memory cells;
   reading back data from the first set and the second set of memory cells of the memory;
   determining that an error exist in both the first set of memory cells and the second set of memory cells of the memory; and
   correcting the errors in the first set of memory cells and the second set of memory cells of the memory by changing a stored value of a memory cell of the memory until it is determined that a single error is present in the two non-overlapping sets of memory cells.

9. The method of claim 8, further comprising identifying a location of the single error in the memory by switching a bit of a first memory cell adjacent to the memory cell having the stored value which was changed.

10. The method of claim 8, further comprising identifying a location of the single error in the two non-overlapping sets of memory cells by evaluating an error correction code.

11. The method of claim 8, further comprising generating an overall parity bit based upon the first parity bit associated with the first set of memory cells and the second parity bit associated with the second set of memory cells.

12. The method of claim 11, further comprising using the overall parity bit to determine that two errors exist in the memory.

13. The method of claim 8, wherein reading back data from the first set of memory cells and the second set of memory cells of the memory comprises continuously reading back frames of data from the memory.

14. A circuit for detecting adjacent bit errors in a memory, the circuit comprising:
   a parity bit generator coupled to receive data bits and generate parity bits associated with data stored in a plurality of memory cells of the memory including at least a first parity bit of the parity bits for data stored in a first set of memory cells of two non-overlapping sets of the plurality of memory cells of the memory and a second parity bit of the parity bits for data stored in a second set of memory cells of the two non-overlapping sets of the plurality of memory cells of the memory, the parity bit generator providing data having the first parity bit and the second party bit to the memory; and
   a data correction circuit coupled to the memory, the data correction circuit enabling the correction of adjacent bit errors in data read back from the memory.

15. The circuit of claim 14, further comprising an overall parity bit generator coupled to receive the first parity bit and the second parity bit from the data read back from the memory, the overall parity bit generator providing an overall parity bit based upon the first parity bit and the second parity bit.

16. The circuit of claim 15, further comprising a syndrome generator coupled to receive the data read back from the memory, the syndrome generator generating a syndrome associated with data read back from the memory.

17. The circuit of claim 16, wherein the syndrome generator generates an adjacent bit error signal based upon the syndrome.

18. The circuit of claim 16, wherein the syndrome generator comprises a check bit generator coupled to receive the data read back from memory, the check bit generator generating the syndrome comprising check bits corresponding to the parity bits of the data bits stored in the first set of memory cells and the data bits stored in the second set of memory cells.

19. The circuit of claim 18, further comprising an error detector coupled to the syndrome generator, the error detector generating an error signal based upon the syndrome.

* * * * *